United States Patent
Molitor et al.

(10) Patent No.: US 12,385,948 B2
(45) Date of Patent: Aug. 12, 2025

(54) TEST APPARATUS FOR TEST CARDS

(71) Applicant: Feinmetall GmbH, Herrenberg (DE)

(72) Inventors: Carsten Molitor, Mötzingen (DE); Aleksandar Markovski, Gärtringen (DE); Helmut Seefeldt, Magstadt (DE)

(73) Assignee: Feinmetall GmbH, Herrenberg (DE)

( * ) Notice: Subject to any disclaimer, the term of this patent is extended or adjusted under 35 U.S.C. 154(b) by 221 days.

(21) Appl. No.: 17/946,982

(22) Filed: Sep. 16, 2022

(65) Prior Publication Data

US 2023/0008782 A1 Jan. 12, 2023

Related U.S. Application Data

(63) Continuation of application No. PCT/EP2021/056995, filed on Mar. 18, 2021.

(30) Foreign Application Priority Data

Mar. 18, 2020 (DE) .......................... 202020101484.6

(51) Int. Cl.
*G01R 1/073* (2006.01)
*G01R 1/067* (2006.01)
(Continued)

(52) U.S. Cl.
CPC ......... *G01R 1/07335* (2013.01); *G01R 1/067* (2013.01); *G01R 1/07307* (2013.01); *G01R 31/2808* (2013.01); *G01R 35/00* (2013.01)

(58) Field of Classification Search
CPC ............ G01R 1/07335; G01R 31/2808; G01R 1/07307; G01R 35/00; G01R 1/067
See application file for complete search history.

(56) References Cited

U.S. PATENT DOCUMENTS

| 4,812,754 A | 3/1989 | Tracy et al. |
| 6,084,422 A * | 7/2000 | Bartholomew .... G01R 31/2808 324/756.07 |
| 2019/0339323 A1 | 11/2019 | Bonaria |

FOREIGN PATENT DOCUMENTS

DE 112004000480 T5 9/2006

OTHER PUBLICATIONS

English Translation of International Preliminary Report on Patentability for PCT/EP2021/056995 dated Sep. 22, 2022, 10 pages.
(Continued)

*Primary Examiner* — Amy He
(74) *Attorney, Agent, or Firm* — Sheppard Mullin Richter & Hampton LLP

(57) ABSTRACT

A test apparatus (1) for test cards (37), comprising a receiving device (3) for holding at least one test card (37) to be tested, comprising at least one contact device (4) for making electrical touch contact with electrically conductive contact points of the at least one test card (37) in the receiving device (3), wherein the contact device (4) can be arranged vertically above the receiving device for the purpose of making touch contact, and comprising an actuating device (19), which is formed to displace the contact device (4) and the receiving device (3) relative to one another for the purpose of establishing the touch contact. It is provided that the receiving device (3) can be displaced by means of the actuating device (19) from a test position, which is located vertically below the contact device (4), into a loading and unloading position, which is laterally spaced apart from the contact device (4), and the other way round.

12 Claims, 4 Drawing Sheets

Figure 1:
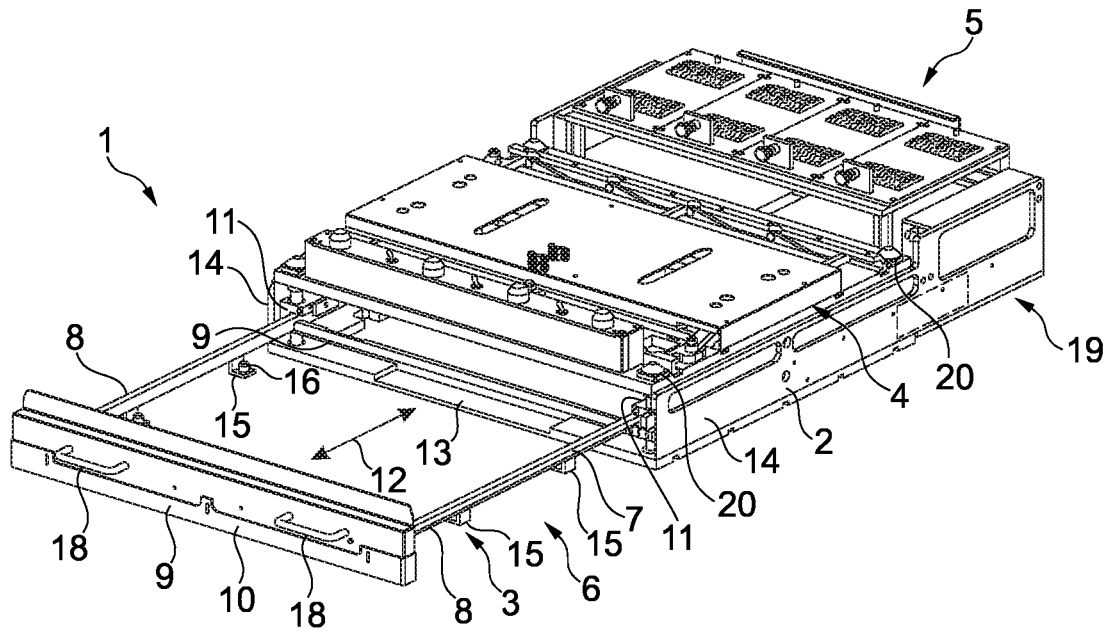

(51) Int. Cl.
G01R 31/28 (2006.01)
G01R 35/00 (2006.01)

(56) References Cited

OTHER PUBLICATIONS

International Search Report and Written Opinion for PCT/EP2021/056995 dated Jul. 27, 2021, 12 pages, English translation of ISR only.

* cited by examiner

TEST APPARATUS FOR TEST CARDS

CROSS-REFERENCE TO RELATED APPLICATION

This application is a continuation of International Application No. PCT/EP2021/056995, filed Mar. 18, 2021, which claims priority to German Patent Application No. 20 2020 101 484.6, filed on Mar. 18, 2020. The contents of each of the which are hereby incorporated by reference in their entirety into the present disclosure.

DESCRIPTION

The invention relates to a test apparatus for test cards, comprising a receiving device for holding at least one test card to be tested, comprising at least one contact device for making electrical touch contact with electrically conductive contact points of the at least one test card in the receiving device, wherein the contact device can be arranged or is arranged vertically above the receiving device for the purpose of making touch contact, and comprising an actuating device, which is formed to displace the contact device and the receiving device relative to one another for the purpose of establishing the touch contact.

Test devices of the above-mentioned type are already known from the prior art. Test cards are used for the purpose of electrically contacting test objects, in order to test the functionality thereof. For this purpose, test cards generally have a plurality of electrically conductive contact elements, which are assigned on one end to the test object and which cooperate on the other end with, for example, a contact distance transformer and a printed circuit board comprising one or several electronic components. Test cards of this type are used for a plurality of test processes, in order to test a test a large number of test objects within a short period of time. In order to ensure that the test cards do not perform any incorrect measurements, the test cards also need to be tested for their functionality. For this purpose, current test apparatuses have a receiving device, in which one or several test cards can be arranged. A contact device, which is formed for the purpose of making touch contact with the test card, is positioned above the receiving device. For the purpose of performing a test process, the contact device is flipped, for example, onto the receiving device, and the contact device is connected subsequently or beforehand to a test device, which is electrically connected to the contact device in order to perform a test on the respective test card. For an exchange of the test card to be tested, the entire contact device has to be removed again, whereby only a small number of test cards can be tested in a given time period.

The invention is based on the object of creating an improved test apparatus, which can perform a large number of tests, in that the exchange of the test cards is simplified and is optionally automated. According to the invention, it is provided for this purpose that the receiving device can be displaced by means of the actuating device from a test position, which is located vertically below the contact device, into a loading and unloading position, which is laterally spaced apart from the contact device, and back. The invention also provides that the receiving device can be displaced laterally or horizontally, respectively. The receiving device can thus be easily pulled out from below the contact device, in order to be loaded with one or several test cards, and in order to subsequently be pushed back below the contact device again. Due to this lateral shifting of the receiving device, a simple exchange of the test cards is possible, in the case of which in particular a disassembling of the contact device can be forgone. The loading and unloading position is characterized in particular in that the receiving device is spaced apart from the contact device so far that one or several test cards can be inserted unhindered into the receiving device from the top.

According to a preferred further development of the invention, the test apparatus has a frame, to which the receiving device and the contact device are mounted. The receiving device and the contact device are held securely on one another and relative to one another and can be displaced as desired by means of the frame.

Particularly preferably, the receiving device is mounted to the frame as horizontally shiftable drawer. For this purpose, the frame or the receiving device have, for example, guide rails, along which the receiving device or the drawer, respectively, can be shifted. A precise and exact guidance from the loading and unloading position into the contact position or the test position, respectively, is ensured by means of the guide rails, so that an advantageous alignment of the one or of the several test cards with respect to the contact device is ensured in the test position. The receiving device thereby preferably has centering means for aligning and arranging the at least one test card, in order to ensure the reliable assignment of the contact device to the electrical contact points of the test card to be tested.

It is furthermore preferably provided that the contact device is mounted in a vertically shiftable manner between a touch contact position and a release position by means of the actuating device. In the touch contact position, the contact device is lowered in the direction of the receiving device and of the test card located therein so far that touch contact is made with the contact points of the test card by means of the contact device. In the release position, the contact device is displaced upwards so far from the test card and the receiving device that the receiving device can be shifted from the test position into the loading and unloading position, without friction occurring thereby between the contact device and the receiving device, in particular between the test card and the contact device.

According to a preferred further development of the invention, the actuating device has at least one first controllable actuator for shifting the receiving device. An automated displacement of the receiving device from the loading and unloading position into the fixed position and the other way round is made possible thereby, so that an at least partially automated operation or a fully automated operation of the test apparatus is possible.

It is furthermore preferably provided that the actuating device has at least one second controllable actuator for displacing the contact device. An automated displacement of the contact device from the touch contact position into the release position and the other way round is thus also made possible. The number of the steps, which a human user or operator of the test apparatus has to perform himself, is minimized by means of the partially or fully automated formation of the apparatus, whereby the efficiency of a test process can be increased and the number of the performed tests can be maximized. An incorrect operation of the test device is furthermore avoided in an advantageous manner. The test apparatus is optionally formed in a fully automatic manner in such a way that the user only has to arrange the respective test card to be tested in the receiving device, and has to remove it therefrom again after the test process has occurred. According to an optional embodiment, the test apparatus moreover has a loading and unloading device, which positions one or several test cards fully automatically in the receiving device or removes it/them therefrom, so that a use of the test apparatus is also possible without manual support from an operator.

Particularly preferably, the first actuator and/or the second actuator in each case have at least one electric motor. The latter can be integrated in a space-saving manner into the test apparatus and can be controlled precisely, in order to ensure the desired movement of the contact device and/or of the receiving device. In the alternative or in addition, the first and/or the second actuator preferably have a hydraulic motor, pneumatic motor, magnet motor, or the like.

According to a preferred further development of the invention, the second actuator is coupled to at least one slider, which can be shifted in particular in parallel to the sliding direction of the receiving device and which has a slide guide, which cooperates with an entraining protrusion of the contact device for the purpose of vertically displacing the contact device.

It is attained by means of the displaceable slider that, on the one hand, a force transmission from the actuator or from the electric motor, respectively, to the contact device takes place and that, on the other hand, an unambiguous guidance of the contact device is made possible by means of the slider. It is ensured by means of the simple formation comprising slide guide and entraining protrusion that the vertical position of the contact device corresponds to the sliding position of the slider at any point in time.

The slide guide preferably has an oblique run-on surface, by means of which the entraining protrusion is lifted or lowered in response to a shifting of the slide.

At least one spring element, which forces the contact device with the entraining protrusion against the slide guide, is thereby preferably assigned to the contact device. It is ensured thereby that the contact device with the entraining protrusion always rests on the slide guide, in particular on the run-on surface, in order to ensure a forced guidance of the contact device as a function of the shifting of the slider. A precise and in particular unambiguous position of the contact device as a function of the sliding position of the slider can thus be attained.

It is furthermore preferably provided that the slide guide has a catch hook for the entraining protrusion on at least one end. It is ensured by means of the catch hook that the entraining protrusion cannot leave the slide guide. Instead, the entraining protrusion is held in a positive manner on the slide guide by means of the catch hook. The slide guide in particular in each case has a catch hook on both guide ends, so that the entraining protrusion cannot be released from the slide guide.

It is furthermore advantageously provided that the contact device is mounted in a vertically shiftable manner by means of at least three guide bolts. The guide bolts extend in particular through guide openings of the contact device in order to ensure an unambiguous mounting and guidance of the contact device.

A spring element, which forces the contact device against the slide guide, is particularly preferably in each case arranged on each of the guide bolts. Due to the fact that a spring element is assigned to each of the guide bolts, an even application of force of the contact device in the direction of the slide guide is ensured, so that inclined positions of the contact device in response to the actuation of the second actuator are also avoided. The contact device is particularly preferably mounted in a shiftable manner by means of four guide bolts, which are arranged in particular on the outer corners of the in particular rectangular receiving device or contact device, respectively. The guide bolts are held in particular by the above-mentioned frame.

According to a further embodiment of the invention, the second actuator preferably has a lifting device, which can be coupled to the support structure. The above-mentioned slide guide on the slide can be forgone in this case. The support structure, which is arranged in the receiving device, can be raised by means of the lifting device, so that not the entire receiving device, but only the support structure is vertically displaced in order to be supplied to the contact device for the purpose of establishing the touch contact. A vertical displacement of the contact device as a whole can be forgone in this case, whereby the control device is only assigned to the receiving device. The test apparatus as a whole is thus designed in an even more compact manner.

The receiving device particularly preferably has an exchangeable support structure, which is formed to hold one or several test cards. In particular, the test apparatus has a plurality of support structures, which can optionally be arranged in the receiving device. The support structures are thereby formed/adapted in particular for different test cards and/or for different numbers of test cards, which are to be tested simultaneously, so that the matching support structure is initially inserted into the receiving device, depending on the test to be performed. The support structures thereby optionally have entraining protrusions, which can cooperate with the above-mentioned lifting device, so that the support structures can be vertically supplied to the contact device independently of the receiving device.

The receiving device preferably has a support frame, on which the support structure can be deposited. The support frame and the support structure are in particular formed in such a way that an unambiguous alignment and arrangement of the support structure on the support frames is ensured, which avoids an incorrect assembly of the support structure. A reliable supplying of the test cards to the contact device for the purpose of making touch contact with the desired contact points is thus ensured.

The support structure is particularly preferably formed in a trough-like manner, so that it has in particular a closed bottom. For example, one or several test cards can be set up on the closed bottom, or the closed bottom in particular serves the purpose of catching dirt particles or the like.

The frame of the actuating device particularly preferably has closed side walls, whereby it is attained that the ingress of dirt particles, moisture or the like into the test apparatus is made difficult or is prevented while performing a test or also beforehand or afterwards.

Particularly preferably, a test device is present, which is or which can be electrically connected to the contact device. The contact device is operated by means of the test device in order to perform the desired tests on the respective test card.

The contact device is particularly preferably formed for receiving one or several different contact modules for the purpose of making touch contact with the at least one test card. For this purpose, the contact device can be adapted to the test process, which is to be performed, in a simple way. The contact modules in particular have plug connections, which can be connected to the test device in order to provide for a simple exchange of individual modules.

Figure 2:
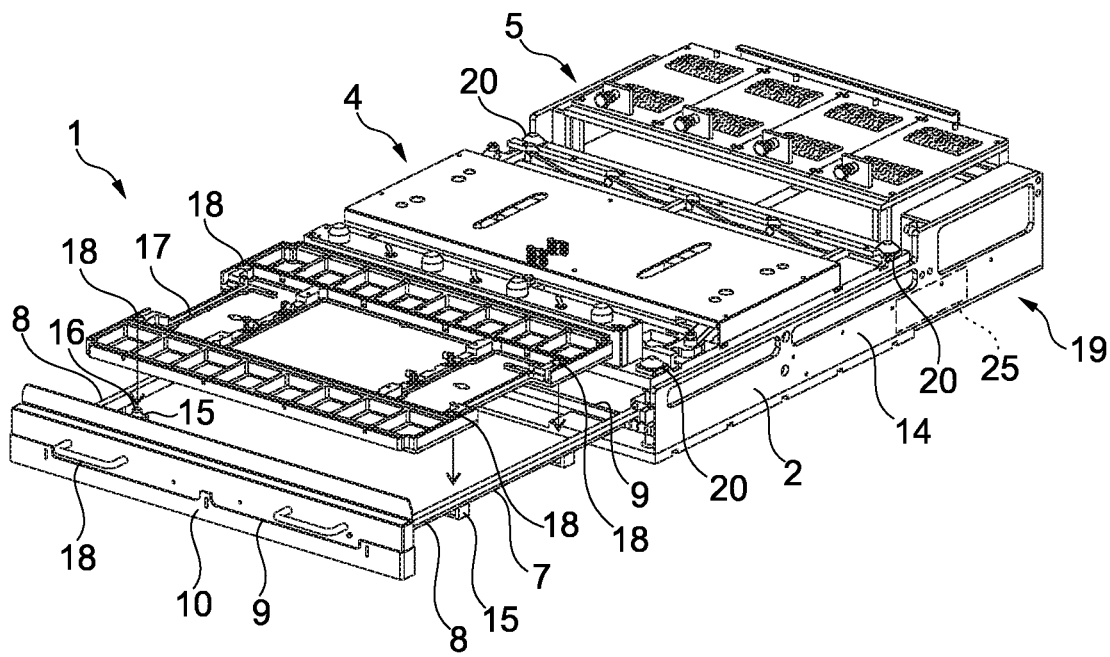
Figure 3:
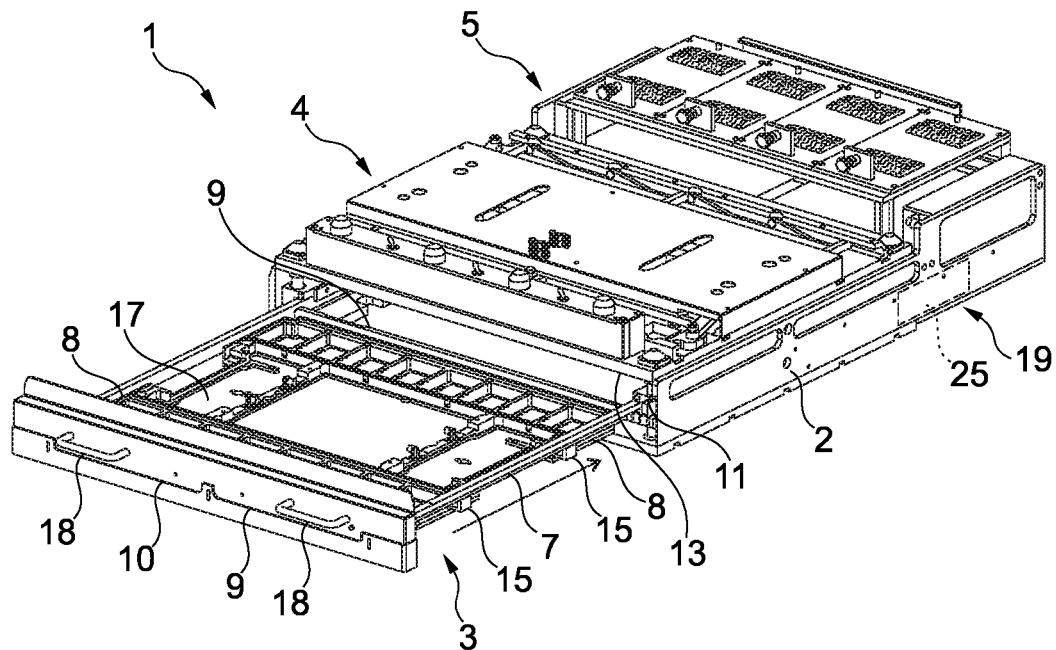
Figure 4:
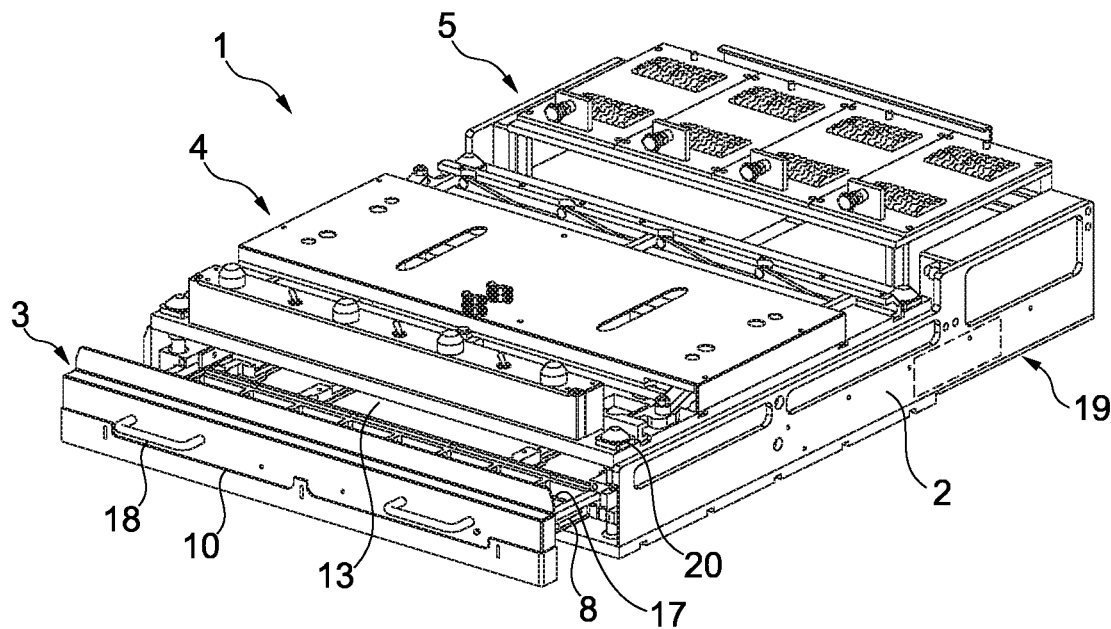
Figure 5:
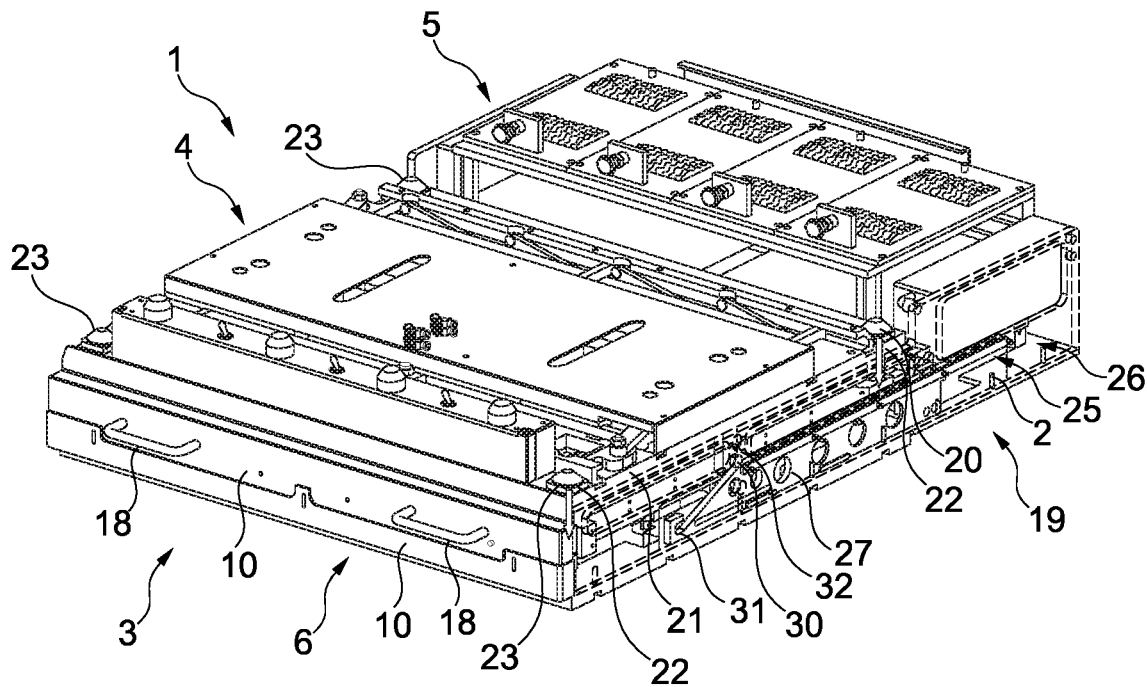
Figure 6:
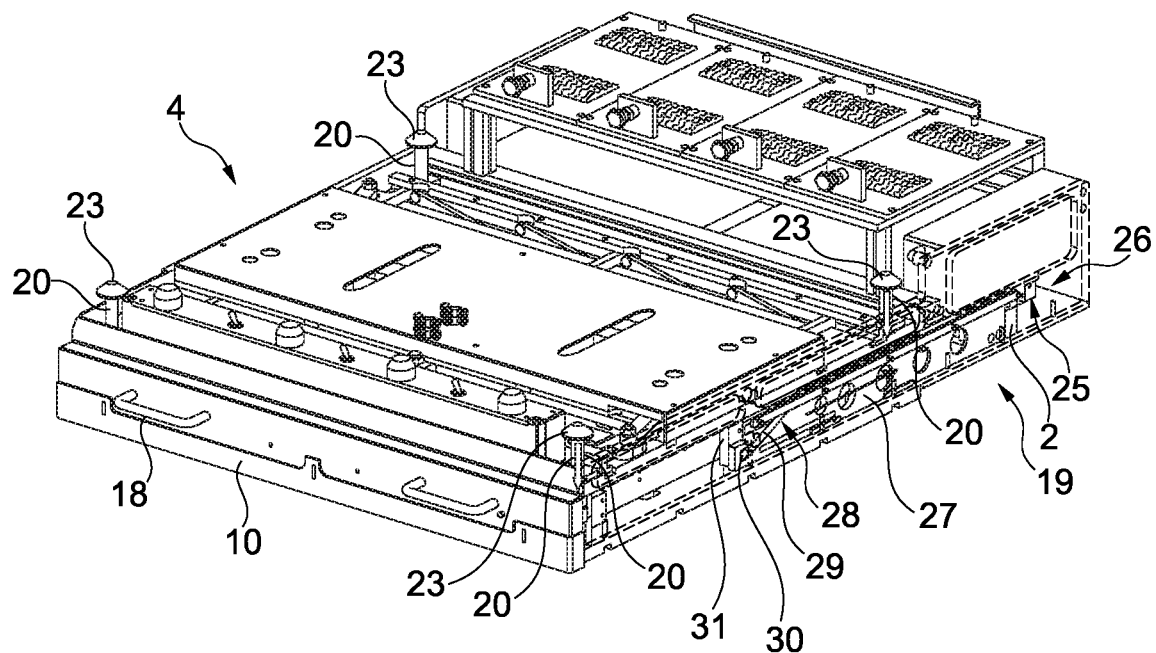
Figure 7:
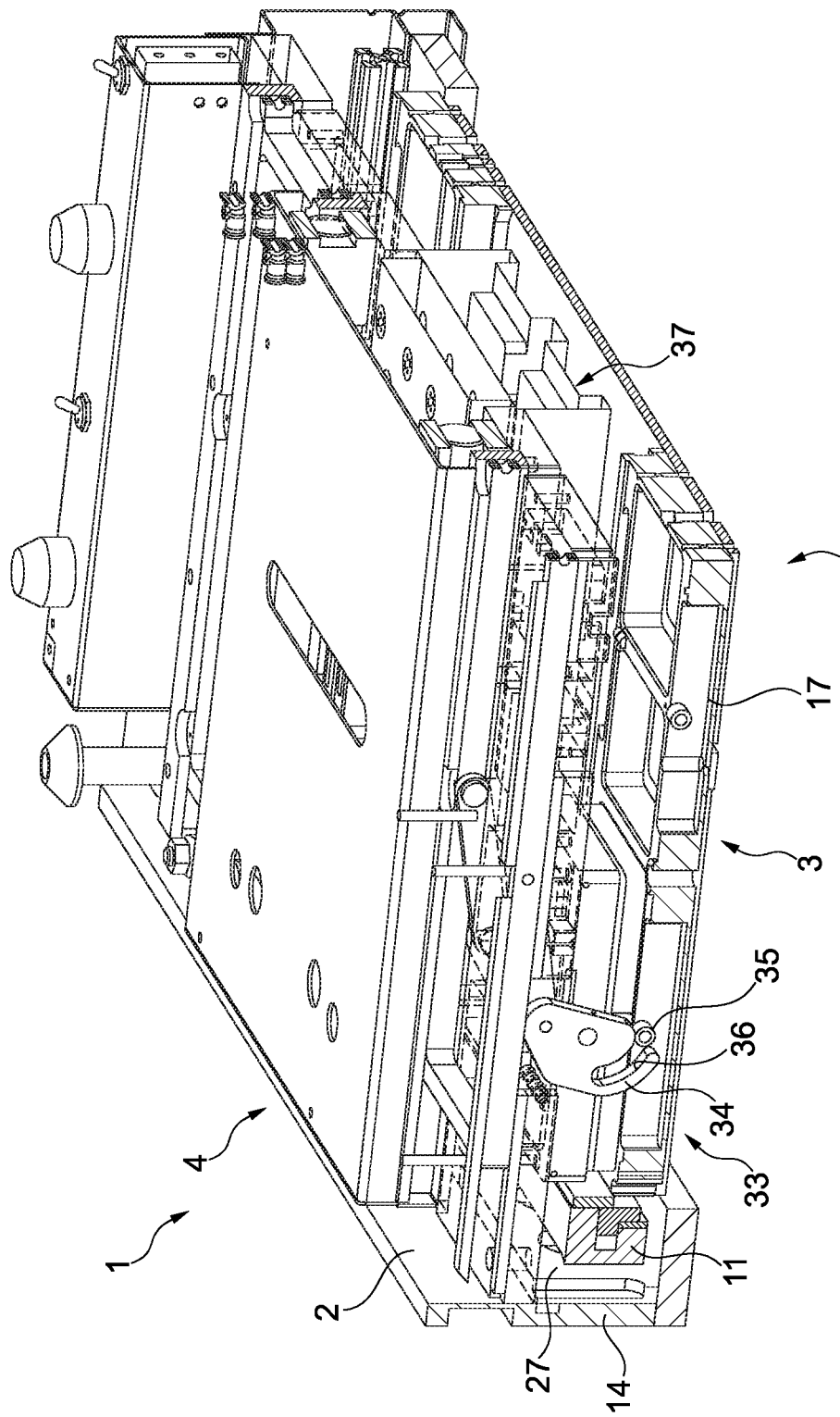

The invention will be described in more detail below on the basis of the drawings, for the purpose of which FIG. 1 shows an advantageous test device according to a first operating state, FIG. 2 shows the test device in a second operating state, FIG. 3 shows the test apparatus in a third operating state, FIG. 4 shows the test apparatus in a fourth operating state, FIG. 5 shows the test apparatus in a fifth operating state, FIG. 6 shows the test apparatus in a sixth operating state, in each case in a perspective illustration, and FIG. 7 shows an optional further development of the test apparatus in a simplified sectional illustration.

FIG. 1 shows an advantageous test apparatus 1 for test cards in a simplified perspective illustration. Test cards, which are used for the purpose of testing electrical/electronic test objects, can be tested with regard to their own functionality by means of the test apparatus 1.

For this purpose, the test apparatus 1 has a frame 2, on which a receiving device 3 and a contact device 4 are arranged. A test device 5, which is or can be electrically connected to the contact apparatus 4 and which is formed to test one or several test cards, which are arranged in the receiving device 3 with regard to its functionality, as will be described in more detail below, is furthermore arranged on the frame 2. The contact device 4 is thereby formed to electrically contact the one or the several test cards by making touch contact and to thus establish the connection to the test device 5.

The receiving device 3 is formed as drawer 6. The receiving device 3 thereby has a support frame 7, which has at least two longitudinal beams 8, which are aligned in parallel to one another and which are arranged spaced apart from one another, which are connected to one another by means of at least two cross beams 9, wherein one of the cross beams 9 has a closing element 10. The longitudinal beams 8 are advantageously mounted in a horizontally shiftable manner in a respective guide rail 11, which is arranged in the frame 2, as suggested by a double arrow 12 in FIG. 1. The frame 2 thereby has an opening 13, through which the longitudinal beams 8 are guided into the guide rails 11, which are arranged in the frame 2. The guide rails 11 thereby rest, for example, on closed side walls 14 of the frame 2 within the frame 2. The closing element 10 is formed to be so large that it completely covers the opening 13 when the drawer 6 is completely inserted into the frame 2. L-shaped holders 15, which in each case have a centering bolt 16, are furthermore arranged on the support structure 7. With a first leg, the holders 15 protrude vertically downwards from the longitudinal beams 8 and with the second, further leg, which is in particular aligned perpendicularly to the first leg and which supports the centering bolt 16, protrude laterally in the direction of the holder 15, which is arranged on the opposite longitudinal beam 8, so that the second legs are aligned essentially horizontally and lie between the longitudinal beams, in a top view onto the receiving apparatus 3.

The support frame 7 is formed to receive and to align an exchangeable support structure 17. For this purpose, FIG. 2 now additionally shows a through-shaped support structure 17, which is supplied to the receiving device 3 vertically from the top, as by means of arrows in FIG. 2, in a further operating state of the test apparatus 1. The support structure 17 is thereby formed as receiving trough, which is formed for the purpose of holding and aligning one or several test cards. The test device 1 thereby preferably has a plurality of support structures 17 of this type, which are formed in an exchangeable manner and which can thus in each case be arranged on the receiving device 3, in order to be able to receive differently formed and/or a different number of test cards. A simple adaptation of the test device 1 to different test cards, which are to be tested, is thus possible with the help of the exchangeable support structure 17.

In particular for each of the centering bolts 16, the support structure 17 has a corresponding centering receptacle 18, into which the centering bolts 16 are inserted when the support structure 17 is attached to the receiving device 3 or the support frame 7, respectively, as shown in FIG. 2. The support structure 17 is thus advantageously aligned on the support frame 7 and is locked to the receiving device 3.

FIG. 3 shows the support structure 17, which is inserted completely into the support frame 7. As soon as the support structure 17 is arranged and held on the support frame 7, the receiving device 3 is slid horizontally into the frame 2 through the opening 13 according to the arrow illustrated in FIG. 3 with the help of the longitudinal beams 8 lying in the guide rails 11, as shown in a further step in FIG. 4. The receiving device 3 is thus shifted from a loading and unloading position, as it is shown in FIGS. 1 to 3, into a test position, in which the support structure 17 is arranged directly vertically below the contact device 4, as shown in FIG. 5. FIG. 5 shows the completely retracted receiving device 3 or drawer 6, respectively, which now completely closes the opening 13 by means of the closing element 10. The closing element 10 optionally has one or several grab handles 18, by means of which a user can manually shift the receiving device 3 from the loading and unloading position into the test position or the other way round. In the alternative or in addition, the test apparatus 1 has an actuating device 19, which has at least one first actuator 25, which comprises an electric motor, which is operatively connected to the receiving device 3 in such a way that the drawer 6 or the receiving device 3 is moved in an automated manner from the loading and unloading position into the test position and the other way round by controlling the electric motor of the first actuator 25.

As soon as the receiving device 3 or the drawer 6, respectively, has reached the test position, in which it lies directly below, thus vertically below the contact device 4, as shown in FIG. 6, the contact device is displaced vertically downwards in the direction of the test card for the purpose of making touch contact with the test card or test cards located in the receiving device 3, as shown by means of arrows in FIG. 6. For this purpose, the contact device is mounted to the frame 2 in a vertically shiftable manner According to the present exemplary embodiment, four guide bolts 20, which are aligned vertically in their longitudinal extension and which are arranged in parallel to one another, are arranged on the frame for this purpose. The guide bolts 20 are thereby in each case arranged in the frame 2 on the outer corners of the contact device 4. In the present case, the contact device 4 has a support plate 21, in which a respective guide opening 22 is formed for each of the guide bolts. The support plate 21 is thus mounted in a vertically shiftable manner in the frame along the guide bolts. On their free end facing away from the contact device 3, the guide bolts 20 in each case advantageously have a head 23 with an outer diameter, which is greater than the diameter of the guide openings 22, so that the support plate 3 is permanently held on the guide bolts 20. A spring element, in particular a helical spring, which is arranged coaxially to the respective guide bolt 20 and which pushes the support plate 21 downwards in the direction of the receiving device 3, as suggested in FIG. 5 by means of arrows, are in each case optionally arranged between the respective head and the support plate 21.

For the purpose of displacing the contact device 4, the actuating means 19 has a second actuator 26, which in particular has an electric motor for driving purposes. Arranged on each side wall 14 of the edge 2, the actuator 26 in each case furthermore has a slider 27, which is aligned in parallel to the side wall 14 and which is mounted in a shiftable manner. The respective slider 27 is operatively connected to the electric motor or to one electric motor each of the actuator 26, so that the respective slider 27 is shifted horizontally and in particular in parallel to the side walls 14 and thus also in parallel to the respective guide rail 11 by controlling the respective electric motor.

On its end facing the opening 13, the respective slider 27 has a slide guide 28. For this purpose, FIGS. 5 and 6 show a side wall 14 in a transparent manner, so that the inner workings of the test apparatus 1 in this region can be seen.

The slide guide 28 has a run-on slope 29, which has a slope in such a way that the height of the slider or of the slide guide 28, respectively, increases away from the opening 13, viewed from the free end. An entraining protrusion 30 of the contact device 4, in particular of the support plate 21, is guided on the slide guide 28. The entraining protrusion 30 thereby rests on the run-on slope 29. On each end of the run-on slope 29, the slide guide 28 moreover has a catch hook 31, 32, which is formed for the purpose of receiving the entraining protrusion 30 in a positive manner and for the purpose of preventing it from an onward movement. The entraining protrusion 30 can thus not leave the slide guide 28, and the actuator 25 is advantageously connected to the contact device 4. In the initial state shown in FIG. 5, the entraining protrusion 30 lies in the upper catch hook 32. In the shown release position, the support plate 21 thus rests in the catch hook 32 on the slider 27 or on the run-on slope 29, respectively, on the upper end and cannot fall downwards. By controlling the actuator 25, the slider 27, as shown by means of a horizontal arrow in FIGS. 5 and 6, is now shifted backwards in the direction of the control device 5 away from the opening 13, so that the entraining protrusion 30 slides downwards on the run-on slope 29, whereby the support plate 21 is moved downwards, and the contact device 4 as a whole is moved towards the receiving device 3 or the test cards located therein, respectively, in order to electrically contact them in the lowered touch contact position through touch. The slider 27 can be displaced backwards maximally so far, until the entraining protrusion 30 is caught in the lower catch hook 31. A reliable and simple vertical displacement of the contact device 4 is thus made possible by means of the actuator 26. By means of the advantageous guidance of the support plate 21 on the guide bolts 20, it is furthermore ensured that the contact device 4 is always optimally aligned to the receiving device 3 in the test position, so that a reliable touch contact with the desired contact points of the test cards located in the receiving device 3 is ensured. The alignment of the test cards is ensured by means of the support structure 17, which is in each case optimally adapted to the test cards, as well as the centered arrangement of the support structure 17 on the support frame 7 with the help of the centering bolts 16. If the test cards are now electrically contacted, a test of the test card can be performed with the help of the test apparatus 5.

By means of the advantageous formation of the receiving device 3 and of the contact device 4, an exchange of the contact device 4 is also possible independently of the receiving device 3, in order to be able to adapt, for example, the contact device, to different tasks. The contact device 4 is in particular formed for the purpose of receiving one or several different or identical contact modules for the purpose of making touch contact with the at least one test card or the several test cards, in order to provide for a simple adaptation of the contact device 4.

In a further sectional illustration, FIG. 7 shows an advantageous further development of the test apparatus 1, wherein elements known from the preceding exemplary embodiments are provided with the same reference numerals and reference is made in this respect to the above description. A test card 37, which is arranged on the receiving device 3, is moreover shown in this exemplary embodiment.

According to the advantageous further development, the test apparatus 1 advantageously has a lifting device 32 of the actuating device 19 in the region of the contact device. The lifting device is formed for the purpose of coupling the contact device to the support structure 17 of the receiving device 3 in the test position. For this purpose, the lifting device 33 has one or several pivotable gripping levers 34, which have a slide guide for an entraining protrusion 35, which is arranged on the respective support structure 17. By rotating the respective entraining lever 34, the entraining protrusion 35 is inserted into the slide guide 36 of the lever 34, wherein the slide guide 36 is formed in such a way that the entraining protrusion 35 is moved upwards in the direction of the contact device 4 in response to the pivoting of the respective lever 34. In addition or alternatively to the vertical displacement of the contact device 4, the support structure as a whole comprising the test cards located therein can thereby be moved in the direction of the contact device 4, for the purpose of establishing the touch contact. If the lifting device 33 is additionally provided, it serves in particular for the fixed connection of contact device 4 and support structure 17 while performing a test.

The invention claimed is:

1. A test apparatus (1) for test cards (37), comprising a receiving device (3) for holding at least one test card (37) to be tested, comprising at least one contact device (4) for making electrical touch contact with electrically conductive contact points of the at least one test card (37) in the receiving device (3), wherein the contact device (4) can be arranged vertically above the receiving device for making touch contact, and comprising an actuating device (19), which is formed to displace the contact device (4) and the receiving device (3) relative to one another for establishing the touch contact, wherein the receiving device (3) can be displaced by means of the actuating device (19) from a test position, which is located vertically below the contact device (4), into a loading and unloading position, which is laterally spaced apart from the contact device (4), and the other way round,
   wherein the test apparatus (1) comprises a frame (2), to which the receiving device (3) and the contact device (4) are mounted,
   wherein the receiving device (3) is mounted to the frame (2) as horizontally shiftable drawer (6),
   wherein the contact device (4) is mounted in a vertically shiftable manner between a touch contact position and a release position by means of the actuating device (19), and
   wherein the actuating device (19) has at least one first actuator (25) for displacing the receiving device (3), and has at least one second actuator (26) for displacing the contact device (4), wherein the second actuator (26) is coupled to at least one slider (27), which has a slide guide (28) comprising an obliquely aligned run-on surface (29), which cooperates with an entraining protrusion (30) of the contact device (4) for vertically displacing the contact device (4).

2. The test apparatus according to claim 1, wherein the first actuator (25) and/or the second actuator (26) in each case have at least one electric motor.

3. The test apparatus according to claim 1, wherein at least one spring element, which forces the contact device (4) with the entraining protrusion (30) against the slide guide (28), is assigned to the contact device (4).

4. The test apparatus according to claim 1, wherein the slide guide (28) has a catch hook (31, 32) for the entraining protrusion (30) on at least one end.

5. The test apparatus according to claim 1, wherein the contact device (4) is mounted in a vertically shiftable manner to the frame (2) by means of at least three guide bolts (20).

6. The test apparatus according to claim 1, wherein the receiving device (3) has an exchangeable support structure (17), which is formed to hold one or several test cards (37).

7. The test apparatus according to claim 6, wherein the second actuator (26) has a lifting device (33), which can be coupled to the support structure (17).

8. The test apparatus according to claim 6, wherein the receiving device (3) has a support frame (7), onto which the support structure (17) can be placed.

9. The test apparatus according to claim 6, wherein the support structure (17) is formed in a trough-shaped manner.

10. The test apparatus according to claim 1, wherein the frame (2) has closed side walls (14).

11. The test apparatus according to claim 1, wherein a test device (5), which is or can be electrically connected to the contact device (4).

12. The test apparatus according to claim 1, wherein the contact device (4) is formed for receiving one or several different contact modules for making touch contact with the at least one test card (37).

\* \* \* \* \*